(12) United States Patent
Lee

(10) Patent No.: US 7,367,281 B2
(45) Date of Patent: May 6, 2008

(54) PLASMA ANTENNA

(75) Inventor: Yong Hyun Lee, Kyeonggi-Do (KR)

(73) Assignee: Jusung Engineering Co., Ltd., Gwangju-shi (KR)

( * ) Notice: Subject to any disclaimer, the term of this patent is extended or adjusted under 35 U.S.C. 154(b) by 404 days.

(21) Appl. No.: 11/067,281

(22) Filed: Feb. 25, 2005

(65) Prior Publication Data

US 2005/0183668 A1 Aug. 25, 2005

(30) Foreign Application Priority Data

Feb. 25, 2004 (KR) ............... 10-2004-0012758

(51) Int. Cl.
  *C23C 16/505* (2006.01)
  *H01Q 3/24* (2006.01)
(52) U.S. Cl. ............... 118/723 AN; 118/723 I; 156/345.48; 343/876
(58) Field of Classification Search ......... 118/723 AN, 118/723 I, 723 IR, 726 IR; 156/345.45, 156/345.48, 345.49; 315/111.51; 204/298.06, 204/298.34
See application file for complete search history.

(56) References Cited

U.S. PATENT DOCUMENTS

| | | | |
|---|---|---|---|
| 5,888,413 A * | 3/1999 | Okumura et al. ............ 216/68 |
| 6,308,654 B1 * | 10/2001 | Schneider et al. ........ 118/723 I |
| 6,444,084 B1 * | 9/2002 | Collins ............... 156/345.1 |
| 6,479,910 B1 * | 11/2002 | Vithayathil ............... 307/139 |
| 6,518,190 B1 * | 2/2003 | Lill et al. ............... 438/710 |
| 2001/0019269 A1 * | 9/2001 | Yudahira ............... 324/426 |
| 2003/0128571 A1 * | 7/2003 | Kawashima ............. 365/145 |
| 2003/0129835 A1 * | 7/2003 | Kholodenko et al. ....... 438/689 |
| 2004/0056602 A1 * | 3/2004 | Yang et al. ........... 315/111.21 |
| 2004/0163764 A1 * | 8/2004 | Collins et al. ........ 156/345.48 |
| 2005/0083221 A1 * | 4/2005 | Seymour ............... 341/150 |

* cited by examiner

*Primary Examiner*—Michael B. Cleveland
*Assistant Examiner*—Tabassom Tadayyon-Eslami
(74) *Attorney, Agent, or Firm*—Marger Johnson & McCollom PC

(57) ABSTRACT

The plasma antenna is designed to allow connection between electric elements within the antenna to be varied without changing the construction of the antenna during a chemical vapor deposition process, thereby maximizing efficiency of a cleaning or deposition process. The plasma antenna comprises two or more coils to which RF power is supplied from an RF power source, respectively, and a switch connected to ends of the coils. The coils are constructed to have different impedances. The circuit construction of the plasma antenna can be changed on the basis of an inductive coupled plasma antenna so as to generate parallel connection type plasma, series connection type plasma, or capacitive coupled plasma according to the kind of process, such as cleaning or depositing, without changing the construction of the antenna, so that the process can be performed efficiently, thereby enhancing productivity through reduction in manufacturing costs attributed to the simple construction of the antenna.

13 Claims, 5 Drawing Sheets

PLASMA ANTENNA

BACKGROUND OF THE INVENTION

1. Field of the Invention

The present invention relates to a plasma antenna for a plasma processing apparatus, and, more particularly, to a plasma antenna, designed to allow connection between electric elements of the antenna to be varied without changing the construction of the antenna during a chemical vapor deposition process, thereby maximizing efficiency of a cleaning or deposition process.

2. Description of the Prior Art

In manufacture of semiconductor devices, various plasma deposition and etching have been developed. This is attributed to the fact that, in comparison to a commonly used chemical vapor deposition process, the plasma deposition process can be performed at a lower deposition temperature and a higher deposition speed due to activation of reactant gases by the plasma. Additionally, the plasma deposition or etching process can be performed more easily by appropriately applying a relative bias to a plasma electrode or a susceptor.

As for a plasma processing apparatus, an inductive coupled plasma processing apparatus, and a capacitive coupled plasma processing apparatus have been widely employed. Additionally, a new type of plasma processing apparatus, which has an electric field generator coupled to basic components of the typical plasma processing apparatus, has been developed.

The conventional inductive coupled plasma processing apparatus employs a single helical antenna or a plurality of separated coil antennas. As RF power is applied to the antenna, a time-variable magnetic field is generated perpendicular to a plane constituted by the antenna, and induces an electric field within a chamber. Then, the electric field heats electrons to generate plasma. That is, as the electrons collide with surrounding neutral gaseous particles, ions and radicals are generated, which are used for plasma etching or deposition. Furthermore, it is possible to control the energy of ion beams incident to a specimen through application of power to a wafer chuck by use of a separate high frequency power source.

FIG. 1 is a schematic view illustrating the overall construction of a semiconductor processing apparatus using an inductive coupled plasma antenna 17 as an example of the conventional plasma processing apparatus.

Referring to FIG. 1, the plasma antenna 17 is equipped on a vacuum chamber 11 for generating plasma in order to perform a deposition process or to remove a coated film on the surface of an object within the chamber during the process. The plasma antenna 17 is equipped with an insulating plate (not shown), which is highly conducive so as to transfer the energy from an RF power source to the plasma through inductive coupling by reducing capacitive coupling between the antenna and the plasma. Meanwhile, the plasma antenna 17 is connected to an impedance matching device 35, which is connected to an RF power source 37. Furthermore, the chamber 11 is formed with a gas injection port 27 for supplying a cleaning gas or a deposition gas, and is equipped at a lower portion with a wafer chuck 29 upon which a wafer to be subjected to deposition is located. Additionally, the vacuum chamber 11 is further formed with an exhaust port (not shown) through which the gas is exhausted to the outside. With such a construction of the inductive coupled plasma processing apparatus 10, initially, the vacuum chamber 11 is evacuated to below a predetermined vacuum level by use of a vacuum pump (not shown), and supplied with a reactant gas for generating the plasma through the gas injection port 27 such that a predetermined pressure is maintained. Then, RF power is applied to the plasma antenna 17 from the RF power source 37. As such, with the plasma processing apparatus, the plasma can be generated by applying an appropriate RF power in a single frequency band or in various frequency bands to an antenna for generating the inductive coupled plasma, such as the plasma antenna 17, surrounding the vacuum chamber.

Meanwhile, the plasma processing apparatus for a cleaning or depositing process used for semiconductor manufacturing equipment employs a helical antenna, as shown in FIGS. 2a and 3a in which a single or a plurality of coils constituting the antenna are connected in series and in parallel, respectively.

In FIG. 2a, an RF power source 41 is connected to a helical antenna of a series circuit through an impedance matching circuit 40. In this construction, since respective coils of the antenna are connected in series, a constant electrical current flows through the respective coils. However, since the constant electrical current flows through the respective coils, it is difficult to control distribution of an inductive electric field. Additionally, since the respective coils constituting the antenna are connected in series, causing voltage drop to be increased by the antenna, an influence attributed to capacitive coupling with the plasma is increased.

Thus, loss of ions and electrons occurs adjacent to an inner wall of the chamber, whereby the plasma is increased in density at the center thereof while being decreased in density at portions adjacent to the inner wall of the chamber.

FIG. 2b is an equivalent circuit diagram of FIG. 2a, in which the RF power source 41 is applied to impedances $Z_1$, $Z_2$, $Z_3$ and $Z_4$ of the respective coils. Here, in the case where the antenna constitutes a series circuit, since the respective coils are connected in series, the sum of the impedances of the respective coils is larger than that of the antenna constituting a parallel circuit in which the respective coils are connected in parallel. As a result, the insulating plate equipped between the antenna and the vacuum chamber can be damaged due to the plasma.

In FIGS. 3a and 3b, a variable capacitor for resonance is connected to a point g of the outermost coil of the antenna 52 having helical windings connected in parallel, and acts to control electric current in the antenna 52, thereby providing plasma having a uniform density. Accordingly, even if the frequency of the power for the plasma supplied to the antenna is increased, the problem of impedance matching does not occur. In this case, when the antenna is employed under a higher vacuum level of several mTorr, it generates plasma exhibiting desirable characteristics, whereas when the antenna is employed under a lower vacuum level of several Torr, it often generates partially concentrated plasma, thereby partially damaging the object to be processed. The primary cause of this is a constructional problem causing the RF power to be concentrated on a specific coil.

As for another construction of the antenna, there is an antenna having a plurality of side coils together with a plurality of coils connected in series, in which independent power sources are applied to the respective coils, and require matching boxes for impedance matching, respectively, thereby complicating the construction of the antenna.

SUMMARY OF THE INVENTION

The present invention has been made to solve the above problems, and it is an object of the present invention to provide a plasma antenna, designed to allow connection between electric elements of the antenna to be changed, if necessary, to generate series connection type plasma, parallel connection type plasma or capacitive coupled plasma without changing the construction of the antenna in a plasma processing apparatus, thereby maximizing efficiency of a process, such as cleaning and depositing.

In accordance with an aspect of the present invention, the above and other objects can be accomplished by the provision of a plasma antenna, comprising: two or more coils; and switches connected to ends of the coils.

The coils may comprise an inner coil with an inner end through which power is input from the outside, and an outer coil, the inner coil having higher impedance than the outer coil.

The switches may comprise: a first switch equipped between the inner end of the inner coil and an inner end of the outer coil; a second switch equipped between an outer end of the inner coil and the inner end of the outer coil or the ground; and a third switch equipped between the inner end of the inner coil and an outer end of the outer coil or the ground.

At this time, the first switch may connect the inner end of the inner coil and the inner end of the outer coil, the second switch may connect the outer end of the inner coil and the ground, and the third switch may connect the outer end of the outer coil and the ground. Additionally, the first switch may disconnect the inner end of the inner coil and the inner end of the outer coil, the second switch may connect the outer end of the inner coil and the inner end of the outer coil, and the third switch may connect the ground and the outer end of the outer coil. Additionally, the first switch may connect the inner end of the inner coil and the inner end of the outer coil, the second switch may connect the outer end of the inner coil and the inner end of the outer coil, and the third switch may connect the inner end of the inner coil and the outer end of the outer coil.

Each of the coils may be wound in a helical shape.

BRIEF DESCRIPTION OF THE DRAWINGS

The above and other objects, features and advantages of the present invention will become apparent from the following description of a preferred embodiment given in conjunction with the accompanying drawings, in which.

DESCRIPTION OF THE PREFERRED EMBODIMENTS

Preferred embodiments will now be described in detail with reference to the accompanying drawings.

The present invention may be applied to a high density plasma apparatus, a plasma enhanced chemical vapor deposition (PECVD) apparatus, or a plasma processing apparatus, such as an apparatus for etching. In the following embodiment, a high density plasma processing apparatus of the present invention will be described in detail.

Conditions for generating the plasma are significantly different in a deposition process and an etching process using plasma. When generating high density plasma by use of an identical inductive coupled plasma apparatus, a plasma processing apparatus for realizing both conditions appropriate for the deposition process and for the etching process is difficult to be implemented.

In the case of an antenna constituting a parallel circuit in which electric elements are connected in parallel, since it has low impedance, high current flows in the antenna, and high density plasma is thus induced by the antenna, thereby allowing uniform plasma to be easily generated on the surface of the wafer. The uniformity of the plasma can be achieved by controlling electric current in respective coils of the antenna according to difference of impedances between inner and outer coils of the antenna. In the deposition process, since the uniformity of plasma on the surface of a wafer is critical for uniform deposition on the surface of the wafer, it is preferable to operate the antenna of the parallel circuit under the condition that the vacuum chamber has a pressure of several mTorr.

In the case of an antenna constituting a series circuit in which the electric elements are connected in series, since it has higher impedance than the antenna of the parallel circuit, a lower electric current flows in the antenna whereas a higher voltage is applied to the antenna. In the cleaning process, since cleanliness within the vacuum chamber is important, and the uniformity of plasma generated in an entire reactant space within the vacuum chamber is critical for maintaining the cleanliness, it is preferable to use the antenna of the series circuit under the condition that the vacuum chamber has a pressure of several mTorr.

The inductive coupled plasma (ICP) as described above requires high electric current as a major factor for generation of the plasma, and is mainly used in the vacuum chamber of a higher vacuum level than the capacitive coupled plasma (CCP). Meanwhile, the capacitive coupled plasma requires high voltage as a major factor for generation of the plasma, and is mainly used in the vacuum chamber of a relatively low vacuum level, for example, several dozens mTorr to several dozens mTorr. Thus, it is more effective to use the capacitive coupled plasma during the cleaning process.

A plasma antenna according to the present invention will now be described in detail with reference to the accompanying drawings.

Figure 1:
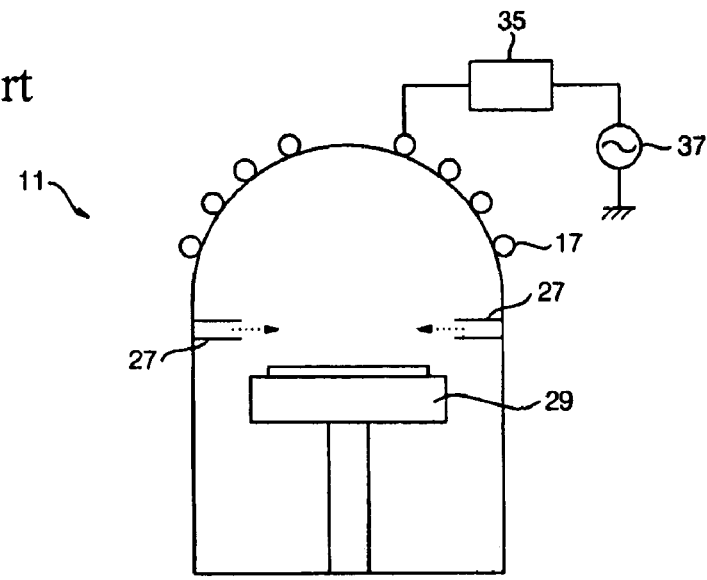
FIG. 1 shows a schematic cross-sectional view illustrating a conventional plasma processing apparatus.
Figure 2A:
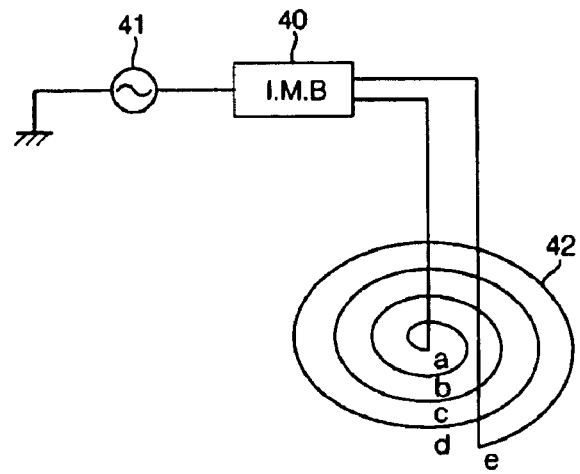
FIGS. 2a to 3b show the construction of a conventional plasma antenna.
Figure 2B:
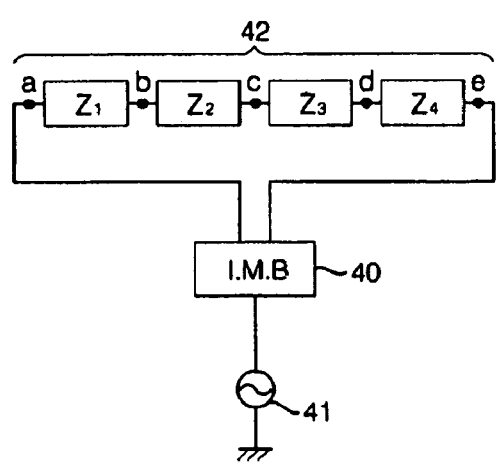
Figure 3A:
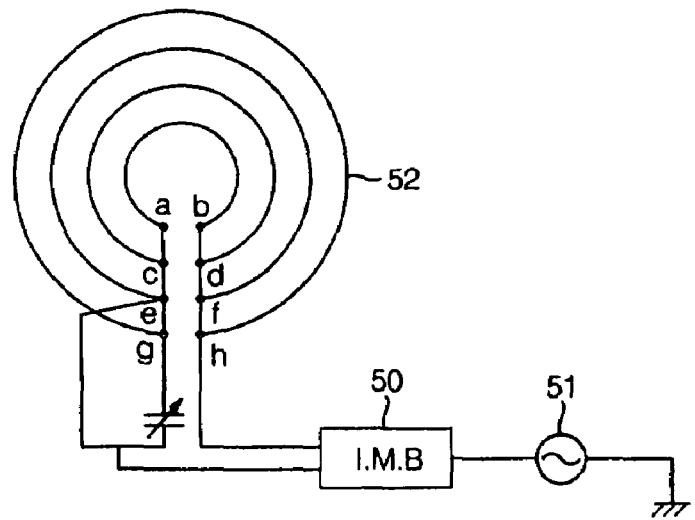
Figure 3B:
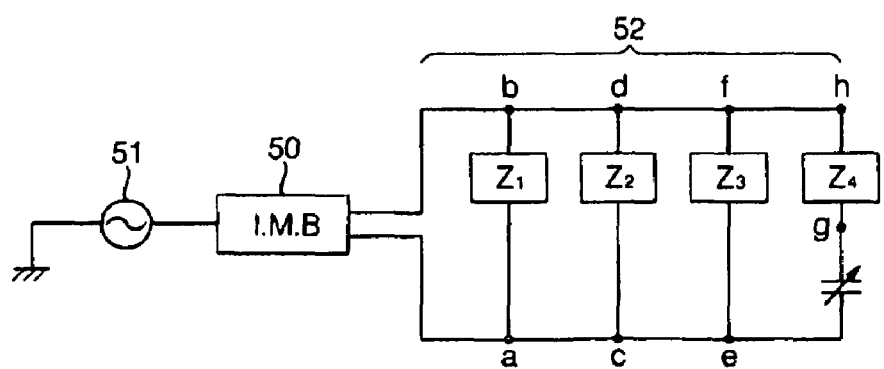
Figure 4A:
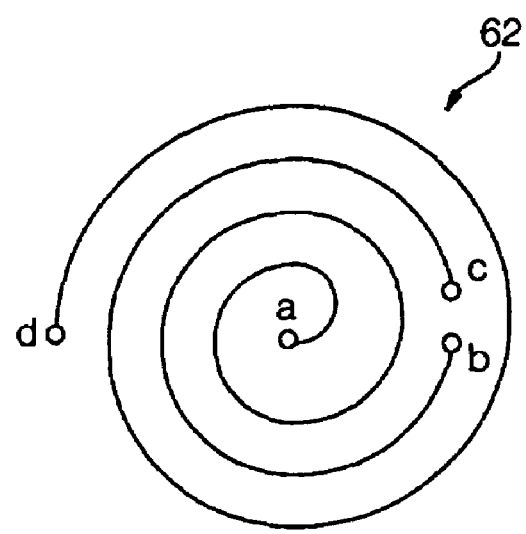
FIGS. 4a and 4b the construction of a plasma antenna in accordance with the present invention and an equivalent circuit diagram thereof, respectively.
Figure 4B:
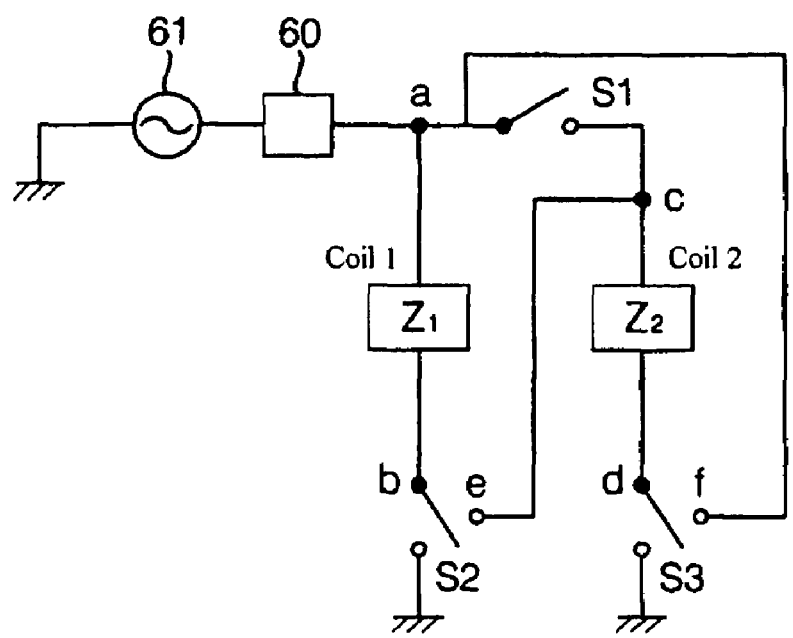

Referring to FIG. 4a, a conceptual diagram of the plasma antenna according to the present invention is illustrated, and FIG. 4b is an equivalent circuit diagram of FIG. 4a. An antenna 62 of the invention is a helical antenna equipped on an outer wall of a vacuum chamber, and a driving unit and electronic circuit thereof are formed into a single matching box 60, which is separated from the vacuum chamber.

In FIG. 4a, the antenna 62 comprises a coil 1 (from point a to point b) constituting an inner winding, and a coil 2 (from point c to point d) constituting an outer winding, in which each of the coils 1 and 2 is helically wound one or more times, and constitutes a series circuit. At this time, the number of windings of each coil 1 or 2 is preferably 2 to 100.

Each of the coils 1 and 2 may consist of a single winding or a double winding.

The coils 1 and 2 are constructed to have impedance difference as follows. That is, when the coil 1 has $Z_1$, and the coil 2 has $Z_2$, the relationship between the coils 1 and 2 can be expressed as $Z_1 > Z_2$. The matching box 60 is equipped between the antenna 62 and a power source 61 to perform impedance matching as is necessary, that is, according to the kind of process. The matching box may be provided as a housing that has a variable capacitor, a matching network, a motor, and the electronic circuit embedded therein.

In FIG. 4a, a difference between RF powers input to the two coils is created due to the difference between the impedance of the inner coil (coil 1) from the point a to the point b and the impedance of the outer coil (coil 2) from the point c to the point d, thereby causing different electric current to flow in the two coils. That is, higher electric current flows in the coil 2 having the lower impedance than in the coil 1 having the higher impedance. Accordingly, more plasma is generated at a portion adjacent to the outer coil (coil 2) than at the inner coil (coil 1). In view of the surface of the wafer, the plasma is not concentrated on the center thereof, and the overall uniformity of the plasma is maintained. That is, when using the antenna constituting the parallel circuit, greater electric current flows in the outer coil of the antenna for the purpose of ensuring the uniformity of plasma on the surface of the wafer.

Meanwhile, the impedance of the coil is related to the number of windings, and the radius of a rotating circle of the coil. That is, the impedance of the coil can be defined as follows:

$$Z = \omega L (\omega = 2\pi f)$$

where Z is an impedance, f is a frequency, and L is an inductance.

From the above relations, it can be appreciated that the impedance is in proportion to the inductance. Accordingly, since the lower the radius of the rotating circle of the coil of the antenna, the lower the impedance of the coil, the inner coil has a lower impedance that that of the outer coil in a typical antenna in the prior art.

In FIG. 4b, the circuit diagram of the antenna according to the embodiment of the invention is illustrated. Three switches S1, S2 and S3 are provided at ends of the inner coil and the outer coil, that is, to the coil 1 and coil 2. For the switch, a vacuum relay or the like is used. The switch SI may connect an inner end a of the inner coil and an inner end c of the outer coil, while an outer end of the inner coil and an outer end of the outer coil, (that is, the coil 2,) are respectively connected to the switches S2 and S3, each of which is grounded at one end thereof. As with a selector switch, each of the switches S2 and S3 can select between the ground and connection to point e or f. More specifically, the switch S2 may connect the outer end b of the inner coil and the inner end c or e of the outer coil, and may also be grounded. The switch S3 may connect the inner end a or f of the inner coil and the outer end d or e of the outer coil, and may also be grounded.

According to the operation of the three switches, the antenna consisting of the inner coil and the outer coil may constitute the series circuit or the parallel circuit.

Figure 5A:
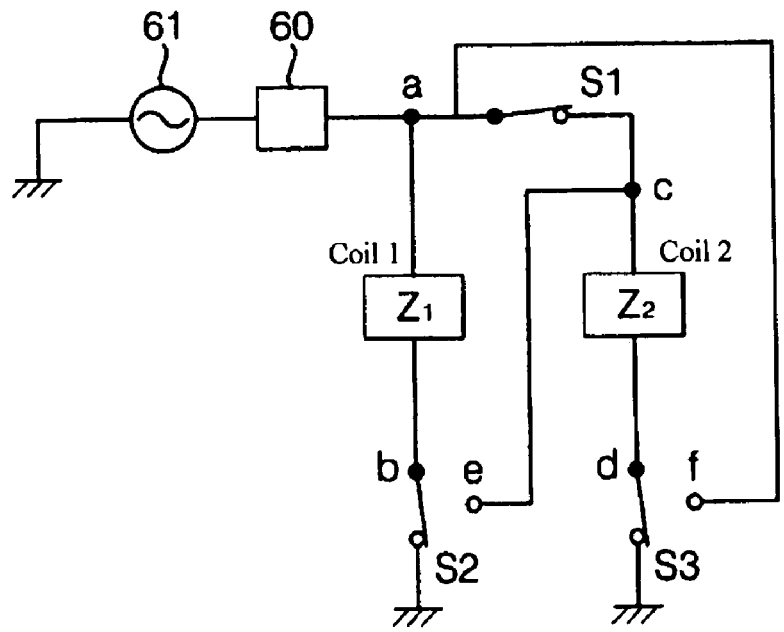
FIGS. 5a and 5b are equivalent circuit diagrams of the plasma antenna in accordance with the present invention.

If the antenna is operated in the parallel circuit for efficiency of the deposition process, the switches S2 and S3 are closed so as to allow the points b and d to be grounded while the switch S1 is closed, thereby constituting the parallel circuit of the antenna, as shown in FIG. 5a. Then, greater electric current is induced to flow in the coil 2 than in the coil 1 positioned at an inner portion of the coil 1 by inducing an impedance difference between $Z_1$ and $Z_2$ that are the impedances of the coils 1 and 2, respectively, thereby inducing the antenna to generate more uniform plasma. As a result, the density of the plasma can be uniformly maintained on the surface of the wafer, thereby allowing effective deposition.

Figure 5B:
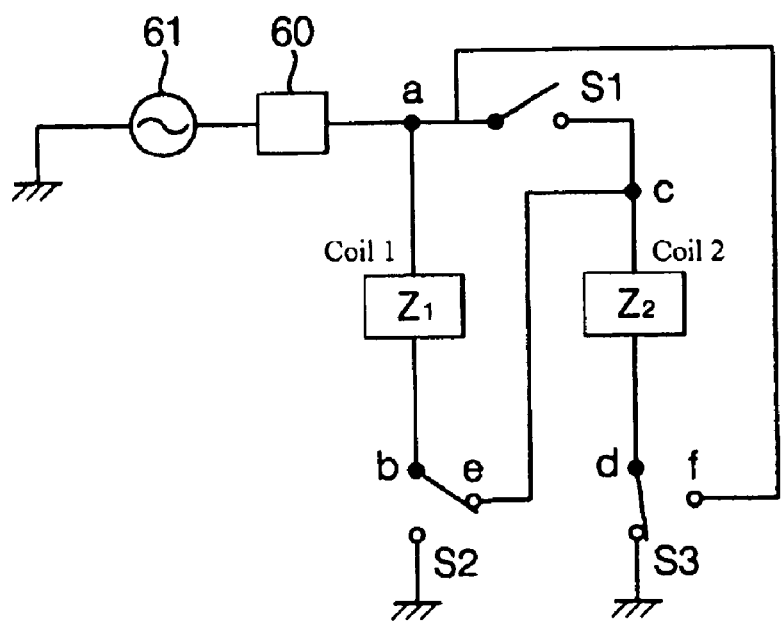

During the cleaning process, series connection type plasma is more effective for cleaning than parallel connection type plasma, and capacitive coupled plasma is more effective than the series connection type plasma. If the antenna is operated in the series circuit, the switch S2 is connected to the point e of the coil 2, and the switch S3 is connected so as to allow the point d to be grounded while the switch SI is opened, thereby constituting the series circuit of the antenna, as shown in FIG. 5b. Then, the density of plasma is uniformly maintained in the entire space of the vacuum chamber, thereby allowing the overall cleaning process to be effectively performed.

Figure 6A:
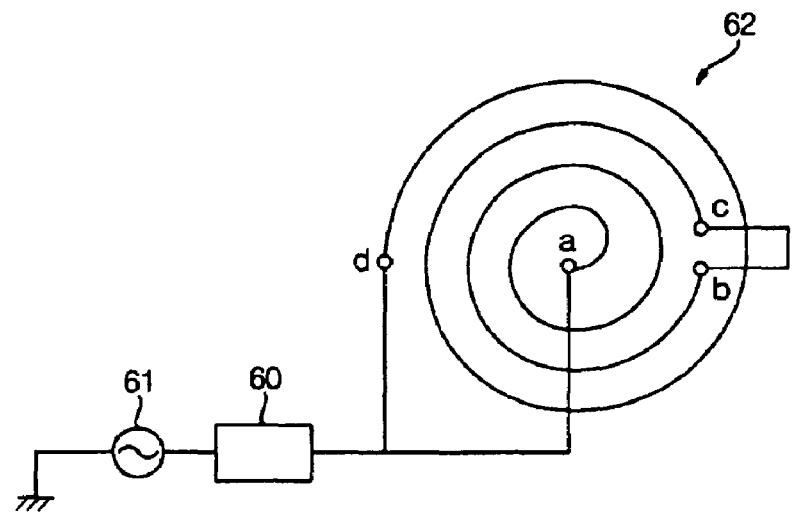
FIGS. 6a and 6b show the construction of a plasma antenna in accordance with the present invention and an equivalent circuit diagram thereof, respectively.
Figure 6B:
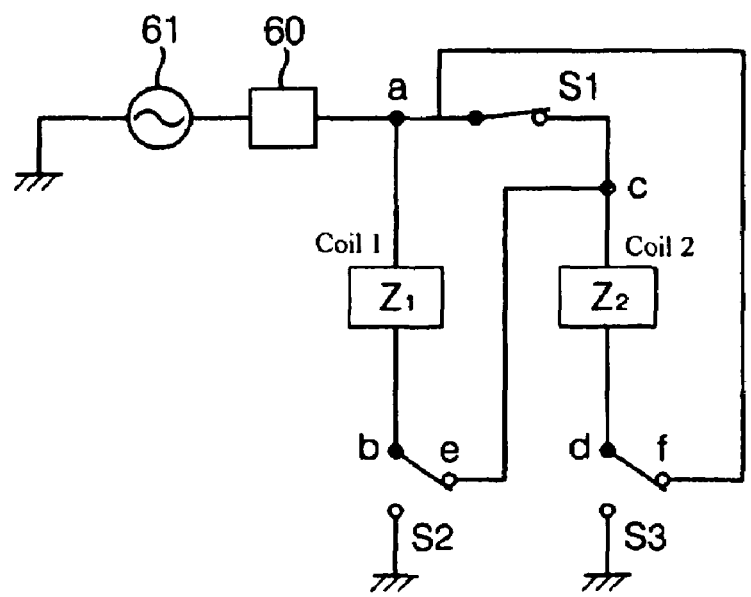

In order to constitute the antenna for generating the capacitive coupled plasma, as shown in FIGS. 6a and 6b, the switch S2 is connected to the point e of the coil 2, and the switch S3 is connected to the point f from which RF power is supplied, while the switch SI is shorted. That is, the power input or output portion of the antenna is shorted, and the antenna is floated from the ground. As such, when shorting the power input or output portion of the antenna, the antenna can be operated to generate the plasma via the effect of the capacitive coupled plasma.

The plasma processing apparatus of the invention can be operated as any of the constructions for generating the series connection type plasma, the parallel connection type plasma and the capacitive coupled plasma through opening or closing operation of the switch without changing the construction of the antenna. Thus, according to the kind of process, such as depositing or cleaning, it is possible to selectively constitute the antenna as the series circuit type antenna, the parallel circuit type antenna, or the capacitive couple plasma antenna in order to maximize the efficiency of the process.

As apparent from the above description, according to the plasma antenna, the plasma within the vacuum chamber can be appropriately controlled through the closing or opening operation of the switches embedded in the plasma antenna according to the kind of process. That is, arrangement of the antenna coils can be changed to provide the parallel connection or the series connection according to the deposition process or the cleaning process, so that the plasma within the vacuum chamber is controllably fed to allow the deposition or cleaning process to be performed most effectively, thereby ensuring establishment of a stable system while enhancing productivity through reduction in manufacturing costs. Furthermore, the antenna of the invention has a simple circuit construction, thereby allowing the antenna to be operated with the construction for the parallel connection type plasma, series connection type plasma or the capacitive coupled plasma through the closing or opening operation of the switches according to the kind of process, such as depositing or cleaning.

It should be understood that the embodiments and the accompanying drawings as described above have been described for illustrative purposes and the present invention is limited by the following claims. Further, those skilled in the art will appreciate that various modifications, additions and substitutions are allowed without departing from the scope and spirit of the invention as set forth in the accompanying claims.

What is claimed is:

1. A plasma antenna, comprising;
   a pair of coils including a first coil and a second coil;
   a first switch disposed between one end of the first coil and one end of the second coil;
   a second switch disposed at the other end of the first coil and switchable between the one end of the second coil and a ground; and
   a third switch disposed at the other end of the second coil and switchable between the one end of the first coil or the ground.

2. The antenna according to claim 1, wherein power is input through the one end of the first coil from the outside, and the first coil has a higher impedance than the second coil.

3. The antenna according to claim 2, wherein the first switch closes between the one end of the first coil and the one end of the second coil; the second switch closes between the other end of the first coil and the ground; and the third switch closes between the other end of the second coil and the ground such that the first coil and the second coil are connected in parallel.

4. The antenna according to claim 2, wherein the first switch opens between the one end of the first coil and the one end of the second coil, the second switch closes between the other end of the first coil and the one end of the second coil, and the third switch closes between the other end of the second coil and the ground such that the first coil and the second coil are connected in series.

5. The antenna according to claim 2, wherein the first switch closes between the one end of the first coil and the one end of the second coil, the second switch closes between the other end of the first coil and the one end of the second coil, and the third switch closes between the one end of the first coil and the other end of the second coil such that the first coil and the second coil are floated.

6. The antenna according to claim 1, wherein at least one of the coils is wound in a helical shape.

7. The antenna according to claim 1, wherein the first coil is disposed along the inner side of the second coil and has a higher impedance than the second coil.

8. The antenna according to claim 7, wherein power is the input through the first coil from the outside.

9. The antenna according to claim 1, wherein the first and the second coils are selectively connectable in series, in parallel, or floated by controlling an opening/closing state of the first, second and third switches.

10. The antenna according to claim 9, wherein the first switch closes between the one end of the first coil and the one end of the second coil; the second switch closes between the other end of the first coil and the ground; and the third switch closes between the other end of the second coil and the ground such that the first coil and the second coil are connected in parallel.

11. The antenna according to claim 9, wherein the first switch opens between the one end of the first coil and the one end of the second coil, the second switch closes between the other end of the first coil and the one end of the second coil, and the third switch closes between the other end of the second coil and the ground such that the first coil and the second coil are connected in series.

12. The antenna according to claim 9, wherein the first switch closes between the one end of the first coil and the one end of the second coil, the second switch closes between the other end of the first coil and the one end of the second coil, and the third switch closes between the one end of the first coil and the other end of the second coil such that the first coil and the second coil are floated.

13. The antenna according to claim 9, wherein the connection of the first and the second coils are convertible among the series circuit, the parallel circuit and the floating mode circuit by controlling the opening/closing state of the first, the second and the third switches.

* * * * *